United States Patent [19]

Reilly et al.

[11] Patent Number: 4,529,892
[45] Date of Patent: Jul. 16, 1985

[54] DETECTION CIRCUITRY WITH MULTIPLE OVERLAPPING THRESHOLDS

[75] Inventors: Robert J. Reilly, Bridgewater; James E. Gillberg, Flemington, both of N.J.

[73] Assignee: RCA Corporation, Princeton, N.J.

[21] Appl. No.: 443,925

[22] Filed: Nov. 23, 1982

[51] Int. Cl.³ .............................................. H03K 5/153
[52] U.S. Cl. .................................... 307/361; 307/269; 307/231; 307/360; 307/271; 307/290; 328/115; 328/116; 328/119; 328/135; 328/146; 328/149
[58] Field of Search ............... 307/231, 360, 361, 271, 307/269, 290; 328/115, 116, 119, 135, 146, 149

[56] References Cited

U.S. PATENT DOCUMENTS

| | | | |
|---|---|---|---|
| 3,290,520 | 12/1966 | Wennik | 307/88.5 |
| 3,639,779 | 2/1972 | Garrigus | 307/552 |
| 3,895,237 | 7/1975 | Harr | 307/351 |
| 3,906,259 | 9/1975 | Nicholas et al. | 307/350 |
| 3,984,703 | 10/1976 | Jorgensen | 307/279 |
| 4,162,454 | 7/1979 | Olsen | 328/147 |

Primary Examiner—Stanley D. Miller
Assistant Examiner—Richard Roseen
Attorney, Agent, or Firm—Joseph S. Tripoli; George E. Haas; Henry I. Schanzer

[57] ABSTRACT

Circuitry for discriminating between input signals having peak amplitudes which fall with two ranges includes two Schmitt triggers having their input terminals connected to a common circuit input terminal. The trigger points of the two Schmitt triggers overlap each other. The potential difference between the upper trigger points of the two Schmitt triggers establishes one of the input signal amplitude ranges. Signals with amplitudes greater than the upper trigger point of the higher of the two upper trigger points fall into the second of the two signal ranges. Decoder circuitry coupled to the outputs of the two Schmitt triggers determine if one or both of the Schmitt triggers is regularly responding to the input signal and thereby the relative amplitude range of the applied signal.

8 Claims, 4 Drawing Figures

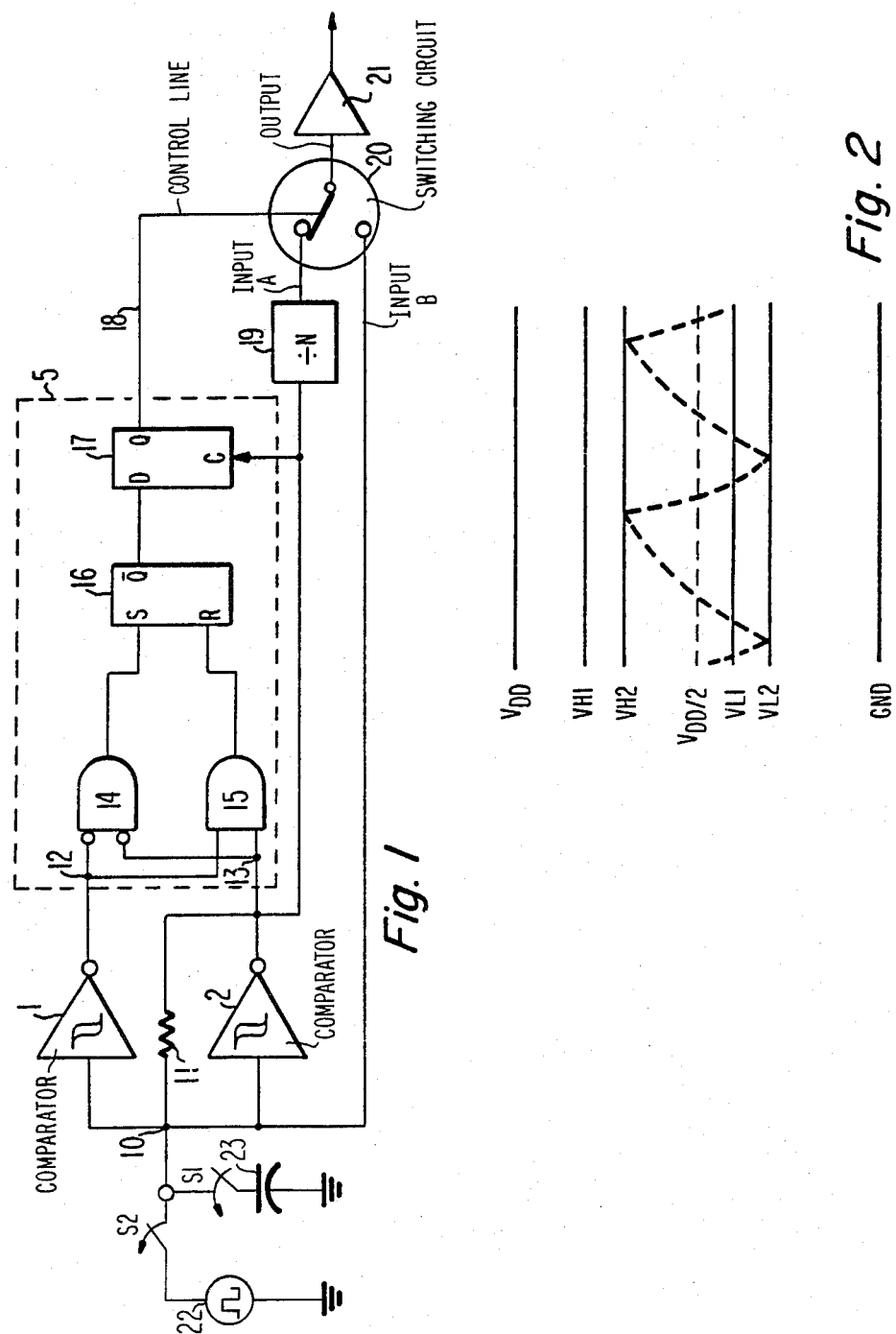

DETECTION CIRCUITRY WITH MULTIPLE OVERLAPPING THRESHOLDS

BACKGROUND OF THE INVENTION

The present invention relates to signal detection circuitry and more particularly to circuitry for distinguishing repetitive waveforms having differing amplitudes.

The invention will be described in the environment of a liquid crystal display (LCD) driver though there are many and varied applications. One such other application is the demodulation of digital amplitude modulated (DAM) carriers, i.e., carriers which are modulated by two discrete amplitudes representing binary ones and zeros. Apparatus of this type is described in U.S. Pat. No. 3,290,520, by L. P. Wennik, entitled "Circuit for Detecting Amplitude Threshold with Means to Keep Threshold Constant". The Wennik circuit is a differential amplifier biased to be substantially unresponsive to peak-to-peak input signals whose amplitude is within a preset threshold range, and to produce an output signal when the input signal exceeds this range. This circuit has a shortcoming in that it is sensitive to noise riding on the input signal and may produce an output signal responsive to a noisy signal whose amplitude is generally within the preset range. It is an object of the present invention to produce a substantially noise insensitive signal amplitude detection circuit.

In LCD driver circuitry, the detection circuit serves to determine when the circuitry is being operated with an internal oscillator or an externally generated clocking signal. Nominally, the internal oscillator produces an oscillatory signal of lesser amplitude than the external signal. The internal oscillator operates at a frequency far in excess of the external signal and is divided down to the external clock rate. The detection signal serves to multiplex the output of the counter or the external clock signal to the LCD output driver.

BRIEF SUMMARY OF THE INVENTION

In the present invention, a pair of comparators exhibiting different hysteresis characteristics have their input terminals connected to a common node. The first comparator has high and low trip points $V_{H1}$ and $V_{L1}$, respectively. The second comparator has high and low trip points $V_{H2}$ and $V_{L2}$, respectively. Trip point $V_{H1}$ is greater than $V_{H2}$ and $V_{L2}$. Trip point $V_{L1}$ is less than $V_{H2}$ and greater than $V_{L2}$. Negative feedback is coupled between the output terminal of the second comparator and the common node. Connecting a capacitor between the common node and a fixed reference potential configures the second comparator as an RC oscillator with the comparator output providing an oscillatory signal. Since the trip point $V_{H1}$ of the first comparator is greater than the trip point $V_{H2}$ of the second comparator, the first comparator is not responsive to the feedback signal at the common node.

Connecting an external clock signal which swings through trip points $V_{H1}$ and $V_{L2}$ to the common node causes triggering of both comparators.

Combinatorial logic responsive to the output signals of both comparators produces an output control signal which exhibits first and second states depending upon whether only the second comparator is triggered by the signal at the common node and or whether both comparators are triggered by the signal at the common node.

BRIEF DESCRIPTION OF THE DRAWINGS

FIG. 1 is a partial schematic diagram of an LCD drive circuit including level detecting circuitry embodying the present invention;

FIG. 2 is a graphic illustration showing the relative threshold values of the comparator circuits 1 and 2 in FIG. 1.

DETAILED DESCRIPTION OF THE INVENTION

Figure 3:
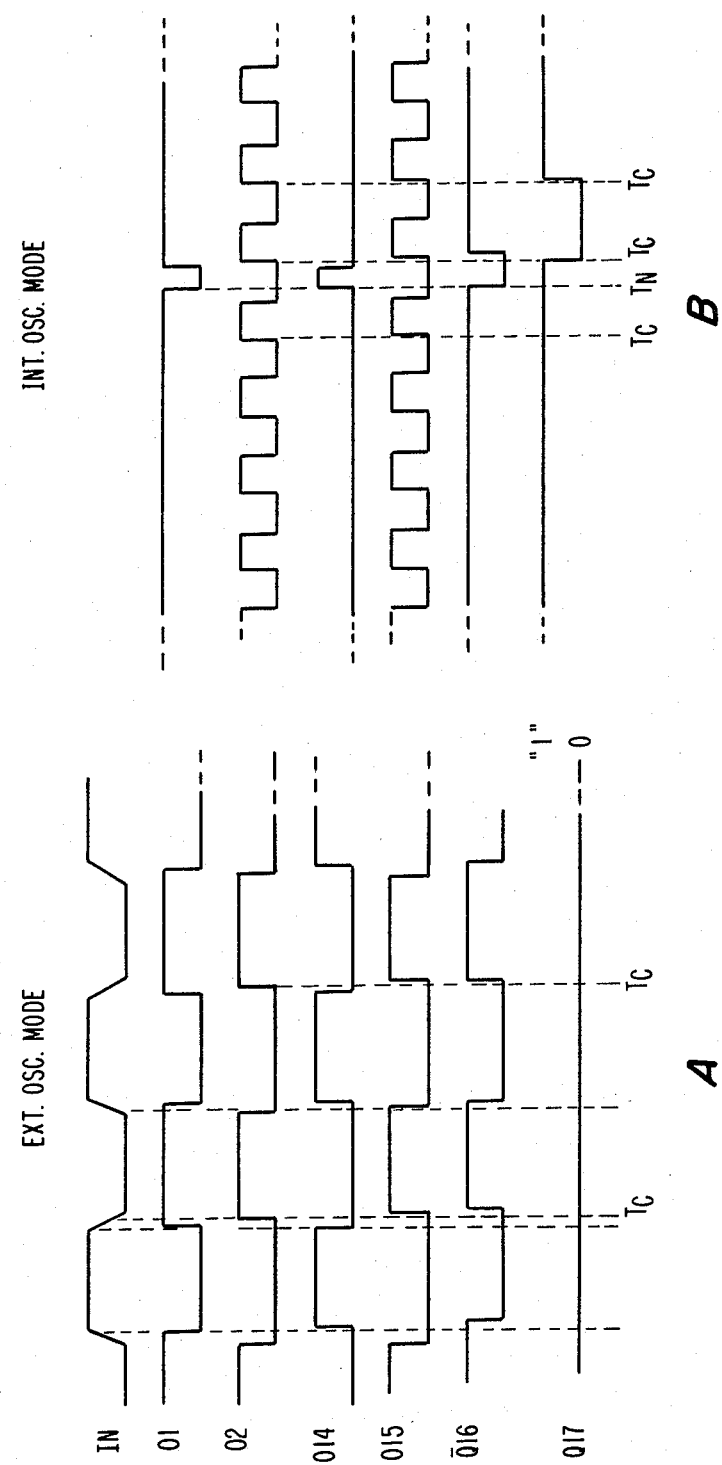
FIGS. 3A and 3B are amplitude vs. time waveforms attendant various interconnections of the FIG. 1 apparatus.

FIG. 1 is a schematic diagram of circuitry which (a) will generate an oscillatory signal when a capacitor is connected to the input connection and apply a divided representation of the oscillatory signal to its output connection or (b) apply an externally generated oscillatory signal directly to its output. The circuit discriminates between the self generated and externally generated signals by detecting their relative amplitudes—the amplitude of the external signal nominally being greater than the amplitude of the self generated signal.

The circuit of FIG. 1 is useful for driving LCD arrays which require an AC backplane voltage, and would generally be included on, for example, a seven segment decoding circuit. In a system where a single driver has sufficient power to drive the LCD array, it is convenient to generate the AC backplane voltage internal to the array which is accomplished in the FIG. 1 circuit by connecting a capacitor to one terminal of the circuit. On the other hand, for large LCD arrays with large backplanes, and where a number of decoder circuits are required to energize the digital elements, it may be necessary to connect a number of backplane drivers in parallel. An arrangement such as this may require that the AC signals from the respective parallel connected backplane drivers be synchronous. Synchronization can be attained if the output of a driver producing a self generated signal is coupled through the other drivers.

LCD decoder driver circuits are generally produced in integrated circuit form with a limited number of external connections. It is therefore desirable to be able to couple the external AC signal to the same connection to which the capacitor would be connected for internally generating the AC signal.

The frequency of the AC backplane signal is nominally between 30 to 60 Hz. However, it is not cost effective to directly generate a stable signal in this frequency range internally. It is more practical to generate a substantially higher frequency AC signal and divide it down to the desired rate. Therefore, it is necessary to detect whether the AC signal is internally or externally generated so that only the former and not the latter is directed through the divider circuitry.

Referring to FIG. 1, a comparator 2, which has an input/output transfer function that exhibits hysteresis, e.g., a Schmitt trigger, has a resistor 11 connected between its input and output terminals to provide negative feedback. When a capacitor (23) is coupled via a switch S1 between the input terminal 10 of comparator 2, and a point of fixed potential, the elements 2, 11 and 23 are configured in a known RC oscillator circuit. Consider comparator 2 to be energized by a supply potential $V_{DD}$ and to have respective high and low trip points $V_{H2}$ and $V_{L2}$, symmetrically disposed about one half the supply potential $V_{DD}/2$, see FIG. 2. The output potential of comparator 2 charges the capacitor toward $V_{DD}$ through resistor 11 when the comparator input potential is less than potential $V_{H2}$. When the potential on the capacitor increases to the level of the upper threshold potential $V_{H2}$, the output potential of the comparator goes low. The capacitor begins to discharge through resistor 11 until the capacitor potential equals the lower trip point $V_{L2}$ at which time the output potential of the comparator again goes high starting a new charging cycle. The repetitive charging and discharging of the capacitor at the comparator input terminal generates a square wave signal at the comparator output terminal. The limits or peaks of the AC potential on capacitor 23 are determined by the trip points $V_{H2}$ and $V_{L2}$ of comparator 2.

The output terminal of comparator 2 is connected to a divide by N counter 19, which may be a binary counter. The divide by N counter reduces the rate of the comparator 2 output signal by the factor N. The output of the divide by N circuit is selectively applied via input A and the output line of switch 20 to a buffer driver 21 by the switch 20. The output of buffer 21 nominally swings between ground and $V_{DD}$. By generating a high rate oscillatory signal, a smaller valued capacitor 23 may be used in the RC oscillator circuit and the rate of oscillation is less affected by supply fluctuations.

A second comparator 1 has an input terminal coupled in common with the input terminal of comparator 2. Comparator 1 is of the same type as comparator 2 and has an input/output transfer function that exhibits hysteresis, e.g. a Schmitt Trigger. The trip points $V_{H1}$ and $V_{L1}$ of comparator 1 overlap those of comparator 2 with $V_{H1} > V_{H2}$ and $V_{H2} > V_{L1} > V_{L2}$ (see FIG. 2). With the trip points arranged in this manner, the output of comparator 1 will remain high when a capacitor 23 is connected to common input terminal 10 since the potential on the input terminal 10 does not attain the value $V_{H1}$ in the self oscillatory mode. Even if a noise spike is coupled onto the signal at terminal 10, which has sufficient amplitude to trigger comparator 1, comparator 1 will be reset high by the succeeding discharge cycle of the capacitor since the comparator 1 lower trip point $V_{L1}$ is a higher value than the lower trip point $V_{L2}$ of comparator 2. It will readily be appreciated that had the comparator 1 trip points been designed to straddle the comparator 2 trip points, comparator 1 would not be reset on the succeeding discharge cycle of the RC oscillator.

Next, consider that an external signal source 22 is coupled to terminal 10 via a switch S2 in lieu of the capacitor 23, and that the source 22 provides a signal to terminal 10 which swings between supply potential, $V_{DD}$, and ground. Signal from source 22 is also applied to switch 20 which selectively connects source 22 via input B and the output line of switch 20 to buffer 21 in the absence of an internally generated AC signal. Since the potential excursion of the signal applied, by source 22, goes through all of the trip points $V_{H1}$, $V_{H2}$, $V_{L1}$, $V_{L2}$, both comparators 1 and 2 follow the input signal. (The comparators have inverting outputs so in fact they complement the input signal).

Decoder circuitry 5 connected to the output terminals of both comparators 1 and 2 detects whether an external signal has been applied to the input terminal 10 or the system is operating in a self oscillatory mode. In decoder 5, a first AND gate 14 has first and second inverting input terminals connected to the output terminal of comparators 1 and 2 respectively. A second AND gate 15 also has first and second input terminals respectively connected to the comparators 1 and 2 output terminals. The output terminals of the first and second AND gates are respectively coupled to the set (S) and reset (R) input terminals of an RS flip flop 16. The complementary output $\overline{Q}$ of the RS flip flop 16 is connected to the data input terminal (D) of a D-type flip flop 17. The clock input terminal, (C), of D-type flip flop 17 is connected to the output terminal of comparator 2 and the Q output terminal of D-type flip flop 17 is connected to control the switch 20.

Operation of the decoder 5 will be described with reference to FIG. 3. FIG. 3A depicts voltage-time waveforms for the system operating with an external AC signal applied to terminal 10. FIG. 3B depicts voltage-time waveforms for the system operating in the self oscillatory mode.

In FIG. 3A, the waveform denoted "IN" is the AC signal applied by the external source and is shown as a square wave with exaggerated rise and fall times to simplify the explanation of circuit operation. Waveforms 01, 02, 014, 015, $\overline{Q}16$ and Q17 are output signals from circuit elements 1, 2, 14, 15, 16 and 17, respectively. Comparators 1 and 2 complement the input waveform "IN", however, they do not produce symmetrical waveforms because their trip points are offset. Comparator 2 is first to respond to a positive going input transition but comparator 1 is first to respond to a negative input transition. This results in the relatively negative pulses from comparator 1 being "framed" by the relatively negative pulses from comparator 2. Conversely, the relatively positive pulses from comparator 2 are framed by the relatively positive pulses from comparator 1. Signals 01 and 02 are coupled to AND gate 14 which generates a high output only for the periods that both signals 01 and 02 are concurrently low. AND gate 15 generates a high output only during those periods when both signals 01 and 02 are concurrently high. The resultant output signals 014 and 015 are non-overlapping signals with less than 50 percent duty cycle.

Signals 014 and 015 applied to the set and reset input terminals of flip flop 16 alternately set and reset the flip flop. Since signals 014 and 015 are non-overlapping, the condition wherein the flip flop 16 may be simultaneously set and reset does not arise. The complementary output, $\overline{Q}$, of flip flop 16 has positive and negative transitions substantially coincident with the positive output transitions of AND gates 15 and 14, respectively. The positive transitions of the flip flop output signal $\overline{Q}16$ are delayed from the positive transitions of the comparator 2 output by the inherent delay time of the AND gates 14 and 15 and of RS flip flop 16.

The output signal $\overline{Q}16$ is applied to the data input terminal of D-type flip flop 17. The output signal 02 is applied to the clock input terminal of flip flop 17. A D-type flip flop will latch the signal present at its data input terminal immediately prior to the positive going transition of the applied clock signal. In FIGS. 3A and 3B, the points in time at which data is latched by flip flop 17 are denoted $T_C$. In the present configuration, the data ($\overline{Q}16$) immediately prior to the positive transition $T_C$ of the clock signal (02) is always low. Thus, the output signal from flip flop 17 is maintained low when the circuit is driven externally by an input signal with a potential excursion which swings through trip points $V_{L2}$ and $V_{H1}$.

The output of flip flop 17 is connected to control the switch 20. A logic low output in the present example will enable switch 20 to couple the input terminal of buffer 21 directly to input terminal 10. In some applications, however, it may be desirable to interpose, for example, signal shaping elements between the switch 20 and input terminal 10.

In general, the circuit will be unaffected by the rise and fall times of the external input signal unless they are of extremely short duration. In this instance, it may be necessary to include some added delay between comparators 1 and 2 and the AND gates 14 and 15 to ensure that the output signals 014 and 015 are non-overlapping. These techniques are well known by those skilled in the art of logic design and will not be expounded further.

When the oscillatory signal is generated internally, there is no applied input signal (FIG. 3B). An AC signal, however, does exist at terminal 10 due to the charging and discharging of capacitor 23, but this signal has insufficient amplitude to trigger comparator 1. As a result, the output 01 of comparator 1 is maintained constant (in the absence of significant noise) at a high level. Comparator 2, on the other hand, generates a square wave signal 02 having a frequency determined by the values of resistor 11, capacitor 23, trip points $V_{H2}$, $V_{L2}$ and the supply potential. In general, the frequency of the 02 waveform of FIG. 3B will be orders of magnitude in excess of the frequency of the 02 waveform of FIG. 3A. Because the comparator 1 output signal 01 is held high, the AND gate 14 output signal 014 is precluded from going high. AND gate 15, on the other hand, replicates the output waveform 02 from comparator 2. The RS flip flop receives no set signal from AND gate 14 and receives successive reset signals from AND gate 15, thereby maintaining its output signal $\overline{Q}16$ high. This high logic level is successively clocked into D-type flip flop 17 by the positive transition $T_C$ of the output signal 02 from comparator 2. The high level output Q17 from flip flop 17 enables switch 20 to couple the output of the divide by N counter 19 to the input terminal of buffer 21.

Consider the occurrence of a positive going noise spike coupled to the capacitor voltage at time $T_N$ and having sufficient amplitude to trigger comparator 1. Comparator 1 will switch states inducing a positive pulse in the output signal 014 of AND gate 14. This pulse at $T_N$ will set flip flop 16 for a portion of one cycle sufficient to cause flip flop 17 to change states. However, for narrow duration noise pulses (less than one cycle of the oscillator frequency) comparator 1 will be reset high on the succeeding discharge cycle of the capacitor 23, no further set pulses will be produced by AND gate 14 and flip flop 17 will be reset high after only one cycle. The total duration of the noise induced anomaly is so short relative to the period of the down counted (divided) output signal cycle time that no noticeable affects will be observed on the LCD array.

The detector circuit has thus far been described in the environment of an LCD backplane driver wherein it can be connected to generate an oscillatory signal internally or to pass an externally generated signal. The detector discriminates its mode of operation by responding to the relative peak amplitude of the oscillatory signal present at the input connection 10. Responsive to the relative amplitude of the signal at terminal 10, the circuit produces a signal at the output Q of flip flop 17. It will be readily appreciated that the circuit will respond similarly to an oscillatory signal applied to terminal 10 having two peak amplitudes sufficient to trip one or both of the comparators and not just to an internally generated (self oscillatory) and externally applied signal. Thus, if a carrier which is amplitude modulated in two quantized levels representing binary data is applied to the circuit input terminal, the output signal produced by flip flop 17 will be the demodulated binary signal.

What is claimed is:

1. In combination:
    a first comparator circuit having high ($V_{H1}$) and low ($V_{L1}$) trip potentials and having an input and an output terminal;
    a second comparator circuit having high ($V_{H2}$) and low ($V_{L2}$) trip potentials and having an input and an output terminal; and wherein $V_{H1} > V_{H2} > V_{L1} > V_{L2}$;
    an input terminal for coupling an oscillatory signal thereto;
    means for connecting the input terminals of said first and second comparator circuits to said input terminal; and
    decoder circuitry connected to the output terminals of the first and second comparator circuits, said decoder circuit generating an output signal exhibiting a first level for oscillatory signals at said input terminal having a peak amplitude at least equal to $V_{H2}$ but less than $V_{H1}$ and exhibiting a second level for oscillatory signals at said input terminal having a peak amplitude at least equal to $V_{H1}$.

2. The combination set forth in claim 1 further including means for coupling negative feedback from the output terminal of said second comparator to the input terminal of said second comparator, wherein a reactive impedance element connected between said input terminal and a point of fixed potential will cause said second comparator to oscillate.

3. The combination set forth in claim 2 further including:
    switch means having a first and a second input terminal, an output terminal and a control terminal, for selectively coupling one of its input terminals to its output terminal;
    means for coupling the output terminal of the second comparator to the first input terminal of the switch means;
    means for coupling said input terminal to the second input terminal of the switch means; and
    means for coupling the output signal from said decoder circuitry to said control terminal.

4. The combination set forth in claim 3 wherein the means for coupling the output terminal of the second comparator to said one of said first and second input terminals includes a frequency divider circuit.

5. The apparatus set forth in claim 4 wherein the decoder includes:
    a first AND gate having first and second inverting input terminals and an output terminal;
    a second AND gate having first and second input terminals and an output terminal;
    a set-reset flip flop having set and reset input terminals and a complementary output terminal ($\overline{Q}$);
    a D-type flip flop having data and clock input terminals and an output terminal corresponding to the decoder output terminal;
    means for coupling the first input terminals of the first and second AND gates to the output terminal of the first comparator;

means for coupling the second input terminals of the first and second AND gates to the output terminal of the second comparator;

means for coupling the set and reset input terminals of the set-reset flip flop to the output terminals of the first and second AND gates respectively;

means for coupling the data input terminal of the D-type flip flop to the complementary output terminal of the set-reset flip flop; and means for coupling the clock input terminal of the D-type flip flop to the output terminal of the second comparator.

6. The combination set forth in claim 5 wherein the first and second comparators are Schmitt triggers.

7. The combinations set forth in claim 1 wherein the decoder circuit includes:

a first AND gate having first and second inverting input terminals and an output terminal;

a second AND gate having first and second input terminals and an output terminal a set-reset flip flop having set and reset input terminals and a complementary output terminal ($\overline{Q}$);

a D-type flip flop having data and clock input terminals and an output terminal corresponding to the decoder output terminal;

means for coupling the first input terminals of the first and second AND gates to the output terminal of the first comparator;

means for coupling the second input terminals of the first and second AND gates to the output terminal of the second comparator;

means for coupling the set and reset input terminals of the set-reset flip flop to the output terminals of the first and second AND gates respectively;

means for coupling the data input terminal of the D-type flip flop to the complementary output terminal of the set-reset flip flop; and means for coupling the clock input terminal of the D-type flip flop to the output terminal of the second comparator.

8. The combination set forth in claim 1 wherein the first and second comparators are Schmitt triggers.

* * * * *